United States Patent [19]

Olson

[11] 4,372,347
[45] Feb. 8, 1983

[54] HYBRID WOVEN GLASS CLOTHS

[75] Inventor: Larry D. Olson, Viroqua, Wis.

[73] Assignee: UOP Inc., Des Plaines, Ill.

[21] Appl. No.: 334,500

[22] Filed: Dec. 28, 1981

[51] Int. Cl.³ .......................................... D03D 15/00
[52] U.S. Cl. ................................ 139/420 C; 428/225;
428/257; 428/258; 428/259; 428/901
[58] Field of Search ............... 428/225, 228, 245, 257,
428/258, 259, 901; 139/420 C

[56] References Cited

U.S. PATENT DOCUMENTS 4,201,247 5/1980 Shannon .............................. 428/288
4,304,811 12/1981 David et al. ........................ 428/245

Primary Examiner—James J. Bell
Attorney, Agent, or Firm—James R. Hoatson, Jr.; Raymond H. Nelson; William H. Page, II

[57] ABSTRACT

Woven hybrid glass cloths which may be utilized as chip carrier substrates and as inner layers in multi-layer laminate circuit boards which will be stable due to a desired co-efficient of thermal expansion may be prepared by weaving fiberglass with a second material which possesses a co-efficient of thermal expansion of less than $5.0 \times 10^{-6}$ inch/inch/°C. The mixture of fiberglass in this material may be used as a warp and a fill yarn. The thus woven cloth will possess a dimensional stability suitable for use in preparing multi-layer materials and for use in direct mounting ceramic chip carriers to this chip carrier substrate. Examples of materials which possess a co-efficient of thermal expansion of less than the desired number will include nylon filaments, ceramics, boron nitrite filaments, etc.

4 Claims, No Drawings

HYBRID WOVEN GLASS CLOTHS

BACKGROUND OF THE INVENTION

Multi-layer laminated boards which may be used as printed wiring boards, which are utilized as components in various electrical and electronic devices, many times possess disadvantageous properties. A major problem which is attendant with many of these laminates which are made of multi-layer substrates is the dimensional stability of the inner layers of the composite board. For example, a multi-layer board may consist of up to 20 layers of substrate materials. When processing these inner layers to form the desired board substrate, the layers are subjected to a thermal stress. During this thermal stress, the inner layers may expand or contract. For example, when utilizing a glass cloth such as a fiberglass cloth, the cloth will exert an effect on the dimensional stability of the inner layers. In this respect, a glass cloth which will expand more than 0.0005 inch/inch will cause registration problems of the pads in the various layers, said poor registration resulting in the inability to connect the inner layers which is cause for either failure or rejection.

Another area in which thermal expansion plays an important role is that of carriers for silicon chips which are used in dual in-line packages for integrated circuitry. Heretofore, silicon chips have been mounted on a chip carrier such as ceramics or plastics which in turn has been mounted on a chip carrier substrate or circuit board. In some instances, it is important that the electrical connection between the chip carrier and the chip carrier substrate is hermetically sealable and possess the ability of being able to withstand temperature cycling. The reason for this is that when the package is subjected to temperature extremes, the solder joints may fracture due to varying thermal expansion properties of the different materials involved and an electrical open core occurs. This is due to the stress which is produced and which is exerted on the solder joints which connect the materials inasmuch as the materials expand and contract at different rates. In order to overcome this problem, it is necessary to utilize a chip carrier or a chip carrier substrate which will have the necessary rate of thermal expansion to insure that the solder joints will not fracture during thermal cycling.

It is therefore readily apparent that if a material can be obtained which possesses a dimensional stability, the material may be used as a component in preparing multi-layer laminates which may, in turn, form the substrate for a printed wiring board and for chip carrier substrates. As will hereinafter be shown in greater detail, such a hydrid glass cloth may be obtained which will possess the desired dimensional stability by combining fiberglass and a second material which possesses a desired co-efficient of thermal expansion.

SUMMARY OF THE INVENTION

This invention relates to hybrid woven glass cloths. More specifically, the invention is concerned with a woven glass cloth possessing a thermal stability which will permit the cloth to be utilized in the preparation of multi-layer laminates and chip carrier substrates, said laminates then possessing a thermal stability which will permit the use thereof as a substrate for a printed wiring board or for surface mounting ceramic chip carriers on chip carrier substrates.

As hereinbefore set forth, printed wiring boards are utilized as a component of various electrical and electronic devices. In order for the aforesaid devices to function in the manner for which they are intended and for a relatively long period of time, it is necessary that the printed boards retain desirable characteristics and be free from any inherent properties which will lead to a breakdown or failure of the board.

It is therefore an object of this invention to provide a woven hybrid glass cloth which will possess desirable physical characteristics such as thermal stability.

A further object of this invention is to provide a woven hybrid glass cloth which possesses a desirable dimensional stability when utilized in the preparation of multi-layer laminates and chip carrier substrates.

In one aspect, an embodiment of this invention is found in a hybrid glass cloth woven from yarn comprising fiberglass and a second material which possesses a co-efficient of thermal expansion of less than about $5.0 \times 10^{-6}$ inch/inch/° C.

A specific embodiment of this invention is found in a hybrid glass cloth woven from fiberglass and nylon, the warp and fill yarn of said cloth being a mixture of fiberglass and nylon filament, the thickness of said woven cloth being in a range of from 0.0015 to about 0.20 inch.

Other objects and embodiments will be found in the following further detailed description of the present invention.

DESCRIPTION OF THE INVENTION

As hereinbefore set forth, the present invention is concerned with a woven hybrid glass cloth which may be utilized in the preparation of multi-layer laminates on chip carrier substrates, said woven glass cloth possessing a dimensional stability sufficient to overcome registration problems of the pads in the layers of the multi-layer laminate or thermal expansion problems of chip carrier substrates. The dimensional stability of the cloth is attained by combining fiberglass yarns with a second material. The co-efficient of thermal expansion of fiberglass is $5.0 \times 10^{-6}$ inch/inch/° C. and by combining the fiberglass with a material containing a co-efficient of expansion less than $5.0 \times 10^{-6}$ inch/inch/° C., it is possible to weave a glass cloth which will then possess the desired thermal stability. Examples of materials which possess the desired co-efficient of thermal expansion (CTE) will include such materials as ceramic filaments, boron nitride filaments and nylon filaments. It is well known that nylon is a generic term for long-chain synthetic polymeric amides with recurring amide groups as an integral part of the main polymer chain. In this respect, there are several varieties of polymeric amides which are known in the trade as Nylon 6, Nylon 66, Nylon 610, Nylon 612, Nylon 11, Nylon 12, Nylon 7, Nylon 8, Nylon 9, Nylon 1313, etc. It is contemplated that many of the nylon filaments may be used, the only criteron being that the CTE is less than about $5.0 \times 10^{-6}$ inch/inch/° C. Some representative examples of the co-efficient of thermal expansion of the various materials is that the CTE of a ceramic filament is $2.8 \times 10^{-6}$ inch/inch/° C., the CTE of boron nitride is $1.1 \times 10^{-6}$ inch/inch/° C. and the CTE of a nylon known in the trade as Kevlar is $0 \times 10^{-6}$ inch/inch/° C.

It is contemplated within the scope of this invention that the fiberglass and the second material which possesses the desired CTE can be combined in any manner, if so desired. One method of combining the two materials is to twist strands of filaments of the dissimilar materials together to make a yarn which may then be woven or, if so desired, a plied yarn may be prepared which consists of a fiberglass yarn and a yarn of the second material. The yarns thus prepared may then be woven in any manner known in the art to form the desired woven cloth, one such method being to interweave a warp yarn and a fill yarn utilizing conventional weaving machines to attain the desired product.

Another method of combining the two materials is by a process known in the weaving industry as "end and end". This process is a method of weaving a cloth in which the weaving is accomplished by not twisting the filaments. Therefore, by this method a cloth may be woven using any combination of yarns. For examples, a cloth may be woven by alternating yarns made of fiberglass and a nylon or by using one yarn of fiberglass and a plurality of yarns of nylon before utilizing another yarn of fiberglass.

In either method of weaving a hybrid cloth, the warp yarn may be of fiberglass and the fill yarn of the combined dissimilar materials or both the warp yarn and the fill yarn may be the combined dissimilar materials.

The woven cloth may then be utilized as a ply in a laminate which, in turn, is used as a substrate for a circuit board or for chip carrier substrates. The plies which comprise the standard laminates may be prepared by impregnating the woven cloth with a resin such as an epoxy resin, various polyimide resins, triazine resin, bis-maleimide-triazine resins, etc., the particular resin which is employed being dependent upon the particular application for which the laminate is to be used. The impregnation of the cloth may be effected in any manner known in the art such as passage through a solution of the resin at a predetermined temperature or by dipping the cloth in said resin solution. Following impregnation of the cloth with the desired resin, the cloth may then be passed through metering rolls so that the selected amount of resin is retained in the cloth, while any excess is squeezed therefrom. Generally speaking, the resin content of the woven cloth may be in a range of from about 10 to about 90% by weight of said cloth.

The impregnated cloth may then be subjected to a B-stage cure by placing the cloth in a heating oven which is maintained at a temperature in the range of about 250° to about 350° F. Thereafter, the impregnated cloth may be laid-up utilizing a predetermined number of plies with at least one sheet of a conductive metal and pressed at a temperature which may range from about 300° to about 500° F. and a pressure in the range of from about 500 to about 1600 pounds per square inch to provide the desired laminate.

It is also contemplated that a ply which may be used to prepare a laminate may also be prepared in a continuous manner by impregnating the woven cloth of the present invention with a resin in a continuous manner, that is, by passing the cloth through the resin and continuously withdrawing said cloth from the resin bath after passage through the resin for a predetermined period of time. The cloth is then continuously passed through metering rolls to control the resin content and through a heater oven wherein the impregnated woven cloth is subjected to a B-stage cure. After passage through the heater oven for a time sufficient to effect the cure, the impregnated woven cloth is continuously withdrawn and utilized as a ply in the preparation of a laminate.

The following examples are given to illustrate the preparation and obtention of a woven hybrid glass cloth. However, it is to be understood that the examples are given merely for purposes of illustration and that the present process is not necessarily limited thereto.

EXAMPLE I

To prepare a woven glass cloth of the present invention, a Kevlar yarn having a 195 denier was plied with a fiberglass yarn of 225 denier. The yarns were twisted together to form a yarn which was used for the warp, while the fill yarn consisted only of Kevlar. The two yarns were woven together in a conventional mill to form a hybrid glass cloth containing 28 yarns per square inch and a weight of 2.9 ounces per square yard. The thus woven hybrid cloth was impregnated with an epoxy resin by dipping the cloth in a solution of epoxy resin which was maintained at a temperature of 72° F. The thus impregnated cloth was then passed through metering rolls to adjust the resin content of the cloth to 48%. Following this, the cloth was then subjected to a B-stage cure at a temperature of 350° F. for a period of 3 minutes. Thereafter, the plies of epoxy impregnated cloth were laminated together at 900 psi and 60 minutes at 350° F. followed by a post-cure for a period of two hours at 350° F.

The impregnated cloth prepared according to the above paragraph was then tested to determine the co-efficient of thermal expansion which was found to be 4 to $5 \times 10^{-6}$ inch/inch/° C. in the X direction and 5.7 to $8 \times 10^{-6}$ inch/inch/° C. in the Y direction.

EXAMPLE II

In a manner similar to that set forth in Example I above, the hybrid glass cloth may be prepared by plying a 195 denier Kevlar filament with a 225 denier fiberglass filament to form a yarn which is used for the warp and the fill in the hybrid glass cloth. After weaving the hybrid glass cloth, it may then be impregnated with a polyimide resin by dipping the cloth in a solution of said resin followed by passage through a metering roll, a B-stage cure, lamination and a post-cure. Similar cloths may also be impregnated with other resins such as triazine resins and bis-maleimide-triazine resins to form plies which may be used in producing a laminate, said laminate having a co-efficient of thermal expansion which is within a predetermined measurement, thus rendering the impregnated cloth more stable than a cloth which is formed from all fiberglass.

EXAMPLE III

Likewise, a hybrid woven cloth may be prepared by alternating yarns of fiberglass and a high temperature nylon known in the trade as Kevlar in the weaving process. The yarn thus produced is used for both the warp and fill yarns in producing the cloth. Thereafter, the cloth may be impregnated with an epoxy resin by passing the cloth through a solution of the resin followed by passage through a metering roll, a B-stage cure, lamination and a post-cure.

I claim as my invention:

1. A hybrid glass cloth woven from yarn comprising a warp yarn of fiberglass and a fill yarn of a boron nitride.

2. The hybrid glass cloth as set forth in claim 1 in which the warp yarn of said cloth is a mixture of fiberglass and a boron nitride and the fill yarn is a boron nitride filament.

3. The hybrid glass cloth as set forth in claim 1 in which the thickness of said woven cloth is in a range of from about 0.0015 to about 0.20 inch.

4. The hybrid glass cloth as set forth in claim 1 in which the yarn size of said fiberglass is greater than about 50 denier.

* * * * *